(12) United States Patent
Cern

(10) Patent No.: US 10,073,132 B2
(45) Date of Patent: Sep. 11, 2018

(54) ANALYZING PARTIAL DISCHARGE IN AN ELECTRIC POWER DISTRIBUTION SYSTEM

(71) Applicant: Telefonaktiebolaget L M Ericsson (publ), Stockholm (SE)

(72) Inventor: Yehuda Cern, Efrat (IL)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 181 days.

(21) Appl. No.: 14/567,248

(22) Filed: Dec. 11, 2014

(65) Prior Publication Data
US 2015/0160284 A1    Jun. 11, 2015

Related U.S. Application Data

(60) Provisional application No. 61/914,789, filed on Dec. 11, 2013.

(51) Int. Cl.
  *G01R 31/12*   (2006.01)
(52) U.S. Cl.
  CPC ......... *G01R 31/1272* (2013.01); *G01R 31/12* (2013.01)
(58) Field of Classification Search
  CPC .................. G01R 31/1272; G01R 31/12
  USPC ......................................................... 324/536
  See application file for complete search history.

(56) References Cited

U.S. PATENT DOCUMENTS

| 6,285,538 B1 * | 9/2001 | Krahn ................. G01R 31/1227 361/104 |
| 7,081,757 B2 * | 7/2006 | Unsworth ........... G01R 31/1209 324/536 |
| 7,532,012 B2 | 5/2009 | Cern |
| 2008/0048710 A1 * | 2/2008 | Cern ................... G01R 31/1272 324/536 |
| 2011/0193563 A1 | 8/2011 | Higgins |
| 2012/0130663 A1 * | 5/2012 | Madhukar ............ G01R 31/027 702/65 |
| 2013/0191049 A1 | 7/2013 | Sales Casais et al. |
| 2013/0205900 A1 * | 8/2013 | Nulty ........................ H02J 3/00 73/514.01 |
| 2013/0271116 A1 * | 10/2013 | Javora ................ G01R 31/1254 324/114 |

FOREIGN PATENT DOCUMENTS

JP      11-248783    *  9/1999 ............. G01R 31/12

* cited by examiner

*Primary Examiner* — Jeff Natalini
(74) *Attorney, Agent, or Firm* — Patent Portfolio Buildera, PLLC

(57) ABSTRACT

There is provided a method that includes (a) detecting a partial discharge on a power line that carries a power signal, (b) measuring a characteristic of the partial discharge, thus yielding a measured characteristic, (c) determining that the measured characteristic satisfies a measurement criterion, thus yielding a qualified partial discharge, (d) incrementing a count of cycles of the power signal that contain qualified partial discharges, (e) calculating, for a plurality of cycles of the power signal, based on the count, a percentage of the plurality of cycles that contain qualified partial discharges, and (f) utilizing the percentage in a subsequent operation. There is also provided a system that performs the method, and a storage device that contains instructions for a processor to perform the method.

32 Claims, 7 Drawing Sheets

TABLE 400

Table of Measures and Outages

| 1 | 2 | 3 | 4 | 5 | 6 | 7 | 8 |
|---|---|---|---|---|---|---|---|
| 2/1/10 0:00 | 5 | | 0 | | 0 | | |
| 2/1/10 12:00 | 7 | | 0 | | 0 | | |
| 2/2/10 0:00 | 4 | | 0 | | 0 | | |
| 2/2/10 12:00 | 8 | | 2 | | 0 | | |
| 2/3/10 0:00 | 6 | | 0 | | 0 | | |
| 2/3/10 12:00 | 10 | 10 | 3 | | 0 | | |
| 2/4/10 0:00 | 12 | | 5 | | 0 | | |
| 2/4/10 12:00 | 13 | | 5 | | 0 | | |
| 2/5/10 0:00 | 15 | | 6 | | 0 | | |
| 2/5/10 12:00 | 10 | | 4 | | 5 | | |
| 2/6/10 0:00 | 13 | | 4 | | 5 | | |
| 2/6/10 12:00 | 15 | | 5 | | 6 | | |
| 2/7/10 0:00 | 18 | | 7 | | 6 | | |
| 2/7/10 12:00 | 20 | 10 | 8 | | 5 | | |
| 2/8/10 0:00 | 14 | | 6 | | 4 | | |
| 2/8/10 12:00 | 10 | | 5 | | 7 | | |
| 2/9/10 0:00 | 21 | | 8 | | 8 | | |
| 2/9/10 12:00 | 23 | | 10 | 10 | 7 | | |
| 2/10/10 0:00 | 19 | | 9 | | 7 | | |
| 2/10/10 12:00 | 19 | | 9 | | 10 | | |
| 2/11/10 0:00 | 21 | | 10 | | 12 | | |
| 2/11/10 12:00 | 25 | 11 | 13 | | 15 | | |
| 2/12/10 0:00 | 31 | | 15 | | 14 | | |
| 2/12/10 12:00 | 27 | | 14 | | 14 | | |
| 2/13/10 0:00 | 23 | | 15 | | 14 | | |
| 2/13/10 12:00 | 24 | | 15 | | 14 | | |
| 2/14/10 0:00 | 23 | | 15 | 10 | 20 | | |
| 2/14/10 12:00 | 34 | | 20 | | 23 | | |
| 2/15/10 0:00 | 40 | | 25 | | 24 | | |
| 2/15/10 12:00 | 42 | 11 | 25 | 40 | 26 | | |
| 2/16/10 0:00 | 51 | | 60 | | 28 | | |
| 2/16/10 12:00 | 55 | 13 | 65 | 10 | 30 | | |
| 2/17/10 0:00 | 62 | | 70 | | | 1 | 2/17/2010 11:30 |
| 2/17/10 12:00 | | | | | | | |
| 2/18/10 0:00 | 0 | | 1 | | 0 | | |
| 2/18/10 12:00 | 0 | | 2 | | 0 | | |

Labels: 415, 420, 425, 410

FIG. 4

ANALYZING PARTIAL DISCHARGE IN AN ELECTRIC POWER DISTRIBUTION SYSTEM

CLAIM OF PRIORITY

This application claims the benefit of U.S. Provisional Application No. 61/914,789, filed Dec. 11, 2013. The disclosure of this document is hereby incorporated herein by reference for all purposes.

BACKGROUND OF THE DISCLOSURE

1. Field of the Disclosure

The present disclosure relates to power lines for distribution of electrical power, and more particularly, to an evaluation of noise and excess current on the power lines, for the sake of identifying a location of a source of the noise or excess current.

2. Description of the Related Art

The approaches described in this section are approaches that could be pursued, but not necessarily approaches that have been previously conceived or pursued. Therefore, the approaches described in this section may not be prior art to the claims in this application and are not admitted to be prior art by inclusion in this section.

In a power grid, buried medium voltage (MV) cables and high voltage (HV) cables degrade over time, especially early models that did not have a protective outer insulating cover and were buried directly in the ground. Such cables often have a coaxial cross-section. An exposed outer neutral sheath may be completely eaten away through chemical interaction with minerals in the earth, thus creating an open circuit in the neutral sheath. The open circuit does not necessarily create an outage, as the earth itself may be conductive enough to complete the circuit. However, this is an unintentional, undesirable, fallback.

These cables are often of an Underground Residential Distribution (URD) type. Replacing such a cable includes digging a trench parallel to the cable, laying and terminating a new cable, and creating a brief outage during which the new cable is connected to the power grid.

There is a large number of such cables. The large number of cables, and economic limitations of utility companies, precludes a timely and systematic program of replacing the URD cables in most localities. Instead, in large measure, power utilities respond to outages. Restoring power after an outage requires a process that may take many hours, and often includes becoming aware of an outage from customer complaints, concluding that an outage is due to a distribution fault, dispatching a line crew, locating the fault, and then performing the replacement process described above. This process lengthens outage duration and often employs expensive emergency crews.

Fault location after an outage is aided by electromagnetic over-current trip detectors, where these are installed on URD cables throughout an underground feeder loop. Transformer covers are opened and a detector is observed, until a last tripped detector is located, indicating a fault location. Alternatively, a feeder cable may be disconnected from its power source, and a type of time domain reflectometry termed "thumping" is used to determine a distance of an anomaly from a cable end.

Partial discharge (PD) is a phenomenon that occurs in insulation that has sustained damage, such as through aging, physical damage, or exposure to excessively high electric fields. PD may afflict cables, connectors, surge arrestors, and other high voltage devices. PD generates short pulses, whose duration is in the nano-second range or shorter. PD pulses tend to occur at certain phases of an AC power voltage, and tend to be roughly synchronized with the power frequency or twice the power frequency. PD is a member of a class of noise known as line-synchronized noise or line-triggered noise. PD pulses have a continuous broadband spectrum spanning at least a range between kilohertz and hundreds of megahertz.

PD in cables, connectors, splices, transformers and other hardware may be a precursor of faults. Similarly, arcing may be a precursor, and may also degrade power quality by introducing flicker and damaging surges. Where feeder degradation is suspected, line crews often use handheld PD detectors. Such detectors may be configured with an open core inductive coupler and a specialized radio frequency receiver or ultrasonic detector. The detector is placed onto a cable, and a visual and/or audio indication of PD signals is provided.

While power cables are designed to carry power frequencies, their construction also provides an ability for them to carry radio frequency signals, such as generated by PD, albeit with a rate of attenuation per meter that increases with increasing frequency. This attenuation is a fortuitous characteristic that can help pinpoint a location of PD and arcing, both of whose signals have broadband spectra that includes radio frequencies.

U.S. Pat. No. 7,532,012 describes a multiple frequency PD detector and monitor, and also describes methods for determining whether a radio frequency signal is synchronized with power frequency, thus pointing to PD or arcing, or whether signals are unsynchronized with power frequency and thus unrelated to PD and arcing. A signal derived from a PD pulse is routed through a plurality of channels, each of which has a different bandpass frequency, so that thereafter, a frequency spectrum of the PD pulse can be analyzed.

There is a need for a technique that will alert a person of a defect in a power cable prior to an occurrence of a fault that would lead to an unscheduled power outage, and will help identify the location of the fault if the fault occurs.

SUMMARY OF THE DISCLOSURE

The present document discloses a method that includes (a) detecting a partial discharge on a power line that carries a power signal, (b) measuring a characteristic of the partial discharge, thus yielding a measured characteristic, (c) determining that the measured characteristic satisfies a measurement criterion, thus yielding a qualified partial discharge, (d) incrementing a count of cycles of the power signal that contain qualified partial discharges, (e) calculating, for a plurality of cycles of the power signal, based on the count, a percentage of the plurality of cycles that contain qualified partial discharges, and (f) utilizing the percentage in a subsequent operation.

The present document also discloses a method in which a radio frequency or ultrasonic sensor is attached to a power cable where a sensor quantifies the magnitudes of partial discharge pulses, the pulses are measured during a power frequency cycle, and a separate count is made of those cycles having pulses whose measure exceeded a threshold and those that did not. A percentage is calculated of the exceeding cycles out of a total number of cycles sensed. The measure may be (a) the highest magnitude pulse occurring during a power frequency cycle, (b) the earliest phase angle that a PD pulse appears during a power frequency cycle, or (c) the total area under a curve of PD magnitude during a power frequency cycle. A percentage exceeding a particular value is an indication of probable near term failure of a cable or device on a power line. A rapid rate of increase of the percentage is an indication of probable near term failure of a cable or device on a power line. The measures are calculated for a max hold waveform calculated over a plurality of cycles. A max hold waveform represents a highest magnitude at each phase angle, and an aggregation of the phase angles represents 360 degrees or one power voltage cycle.

The present document also discloses a method in which data measures from an array of multiple radio frequency or ultrasonic sensors is aggregated at a data processor, where data from each sensor is tagged with its location in space or along an electrical feeder cable, and where a data processor identifies locations with severe partial discharge. The locations and dates of outage-causing faults are also fed to a processor, and said processor correlates partial discharge data with fault data. Additionally, the processor calculates the correlation between data measures and subsequent faults occurring a certain time period following a recording of the measures.

The present document also discloses a method in which a radio frequency or ultrasonic sensor is attached to a power cable. The sensor quantifies the magnitudes of partial discharge pulses. The pulses are measured during a power frequency cycle, and a separate count is made of those cycles having pulses whose measure exceeded a threshold and those that did not exceed a threshold. A percentage is calculated of the exceeding cycles out of a total number of cycles sensed. This method may be improved to increase sensitivity, where PD occurs only occasionally, and many power voltage cycles are PD-free. This method may employ a max hold function, such as found on many spectrum analyzers. Here, measures are calculated for a max hold waveform calculated over a plurality of cycles. The max hold waveform represents a highest magnitude at each phase angle over an aggregation of phase angles ranging from 0 to 360 degrees, or one power voltage cycle.

The present document also discloses a system that performs the above-noted methods, and a storage device that contains instructions for controlling processors to perform the methods.

BRIEF DESCRIPTION OF THE DRAWINGS

FIG. 4 is a table that shows an example of PD percentages and a simulated alert and alarm output from a monitoring station.

A component or a feature that is common to more than one drawing is indicated with the same reference number in each of the drawings.

DESCRIPTION OF THE DISCLOSURE

Figure 1A:
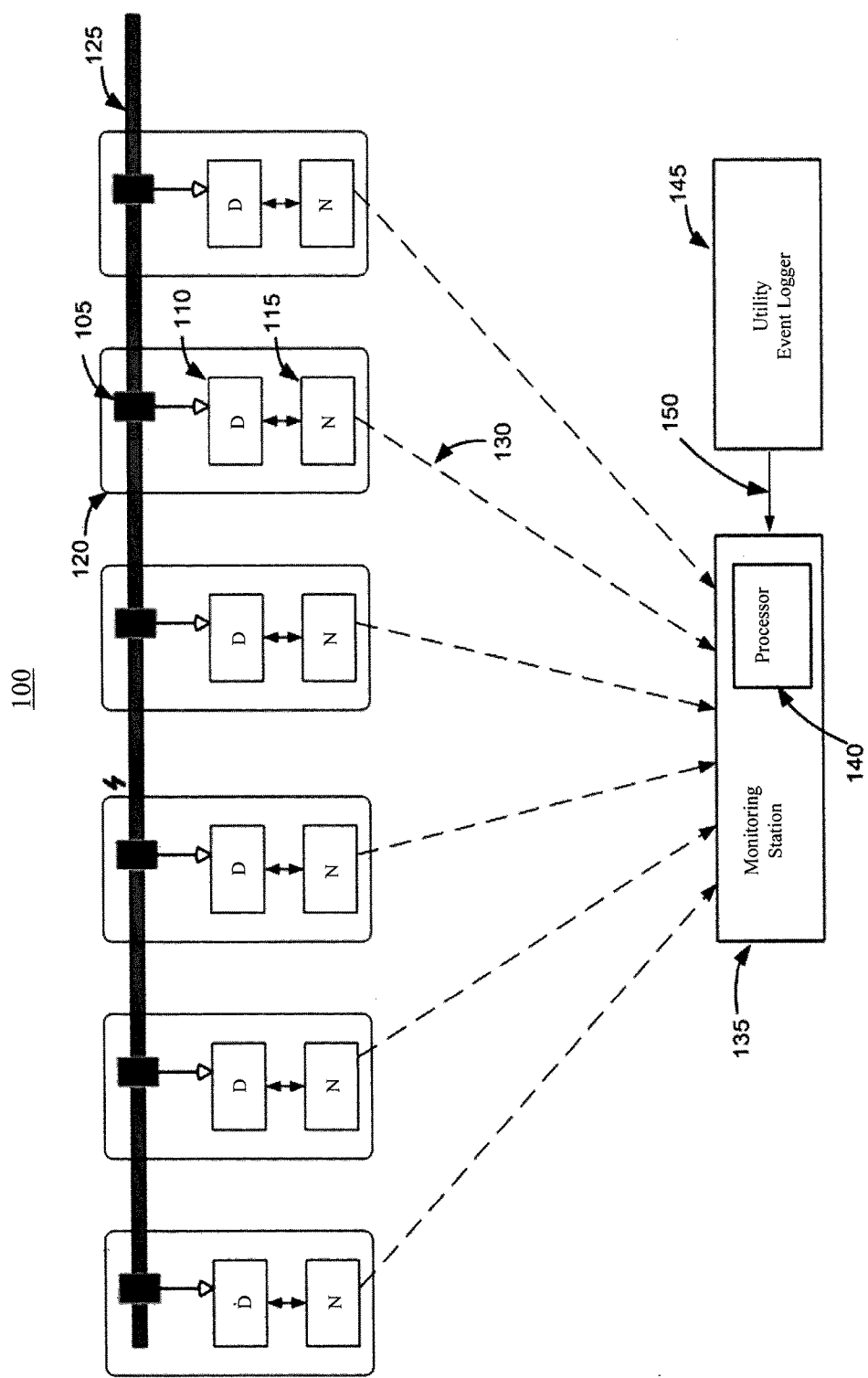
FIG. 1A is a block diagram of a system for analyzing partial discharges on a power line in a power distribution system.

FIG. 1A is a block diagram of a system 100 for analyzing PD on a cable 125 in a power distribution system. System 100 includes a coupler 105, a detector 110, a node 115, a monitoring station 135, and a utility event logger 145.

Node 115 is in communication with monitoring station 135 by way of a link 130. Node 115 and detector 110 are related such that node 115 is a master and sends data requests to detector 110. Link 130 may be either a wire link or a wireless link. Monitoring station 135 includes a processor 140 that runs software termed a Network Management System (NMS).

Coupler 105 is an inductive coupler situated on cable 125 in a cabinet enclosing connections to transformer 120. Cable 125 is a URD cable and transformer 120 is a distribution transformer. If PD or arcing is present on a cable 125 at some not-too-distant location, up to hundreds of meters from coupler 105, coupler 105 outputs a radio frequency signal. Coupler 105 also outputs a power frequency voltage proportional to a power current flowing through cable 125. Coupler 105 outputs the radio frequency signal and the power frequency voltage via an output that is routed to detector 110.

Figure 1B:
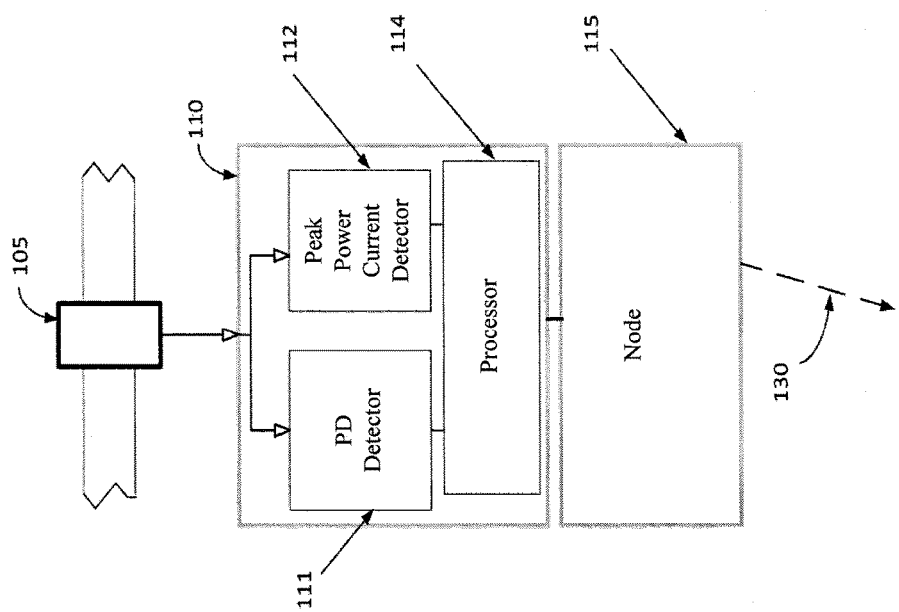
FIG. 1B is a block diagram of a portion of the system of FIG. 1A.

FIG. 1B is a block diagram of a portion of system 100 that shows detector 110 in greater detail. Detector 110 is downstream of coupler 105 and includes a PD detector 111, a peak power current detector 112, and a processor 114, and may be termed a Partial Discharge Monitor (PDM)/Peak Current Monitor (PCM). Monitoring peak current in addition to detecting PD in a power distribution system is useful, especially if backup power keeps the power distribution system in operation for long enough to issue a "last gasp" notification to monitoring equipment in case of an outage.

PD detector 111 and peak power current detector 112 receive the output from coupler 105. PD detector 111 detects PD signals at multiple radio frequencies, and peak power current detector 112 interprets the power frequency voltage as power current. Outputs from each of PD detector 111 and peak power current detector 112 are provided to processor 114.

Processor 114 is downstream from PD detector 111 and peak power current detector 112, and includes (a) an analog to digital (A/D) converter (not shown) for converting analog signals from PD detector 111 and power current detector 112 into digital signals, and (b) a digital processor (not shown) for processing the digital signals. Processor 114 processes signals from PD detector 111 to detect, i.e., qualify a detected signal as being PD, and analyze PD, and processes signals from power current detector 112 to measure steady state and peak values of current flowing through, cable 125. Data from processor 114 is routed to node 115.

Node 115 further processes the data from processor 114, thus yielding processed data, and communicates the processed data via link 130 to monitoring station 135. Thus, node 115 may be regarded as a processor.

Node 115 interrogates peak power current detector 112 every one or two seconds. Peak power current detector 112 captures and memorizes the highest instantaneous current seen since the last time it was interrogated. Should an over-current be detected by processor 114 or the processor in Node 115, or if PD on a least one frequency channel exceeds a threshold, node 115 communicates an alarm to monitoring station 135.

System 100 includes, and FIG. 1A shows, situated on cable 125, a plurality of couplers, detectors and nodes that are similar to coupler 105, detector 110 and node 115, respectively. System 100 thus monitors PD and peak power current at multiple locations along cable 125, and a fault will cause over-current to be sensed at all locations between a power feed and the fault, while normal current will be sensed downstream of the fault. So a synergism of an inductive coupler sensing power current, PD and arcing allows system 100 to quickly localize an outage-causing fault and also allows for observing precursors of such faults before they occur. Further, a constant monitoring and on-line performance of system 100 reduces the time to detect and locate a distribution fault, which often comprises the main component of the duration of an outage.

As mentioned above, PD detector 111 detects PD at multiple frequencies. More specifically, in PD detector 111, a signal derived from a PD pulse is routed through a plurality of channels, each of which has a different bandpass frequency, so that thereafter, a frequency spectrum of the PD pulse can be analyzed.

Figure 2:
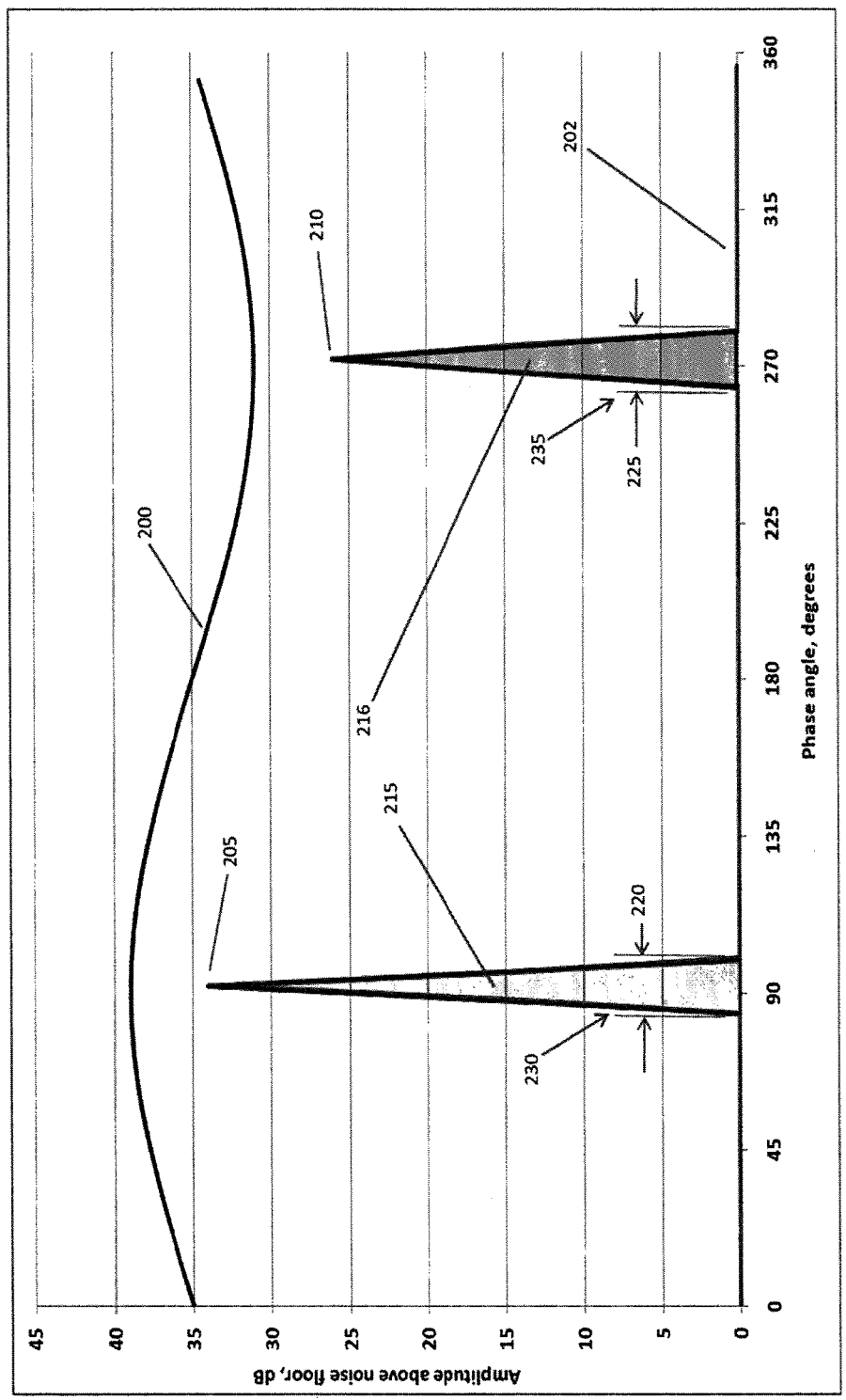
FIG. 2 is a graph of PD measures for a frequency channel.

FIG. 2 is a graph of PD measures for one of the frequency channels. A horizontal axis 202 represents a phase angle scale, where zero degrees on horizontal axis 202 is identical to a phase of a positive-going zero-crossing phase of a medium voltage waveform on cable 125. A power voltage sine wave 200 is shown reaching its positive peak at 90 degrees and its negative peak at 270 degrees.

The PD measures include magnitude 205 of a highest magnitude pulse occurring during a power voltage cycle, and an onset or earliest phase angles 230 and 235 of a PD pulse signal during the positive and negative phases respectively of the power voltage cycle. Further PD measures are the total areas 215 and 216 under a magnitude-time graph for the power voltage cycle, and the phase widths 220 and 225 of a PD signal within a power voltage cycle. Some PD phenomena have different behavior for positive and negative voltage phases, so additional measures include a ratio between peak magnitudes 205 and 210 of the positive and negative phases respectively, the difference between onset phases 230 and 235 of the positive and negative phases, and a ratio of area 215 during a positive phase and area 216 during a negative phase. The physical nature of PD is such that all of these parameters vary over time, and time averages over a number of sampled cycles, such as 100 cycles, provide an aggregated measure over time of PD severity, compared to examining the PD of single cycles. In particular, calculating a percentage of PD measurements that exceed a certain threshold of one or more measures is itself a useful measure of PD severity. New cables are generally PD-free, and PD usually grows slowly over time.

Figure 3:
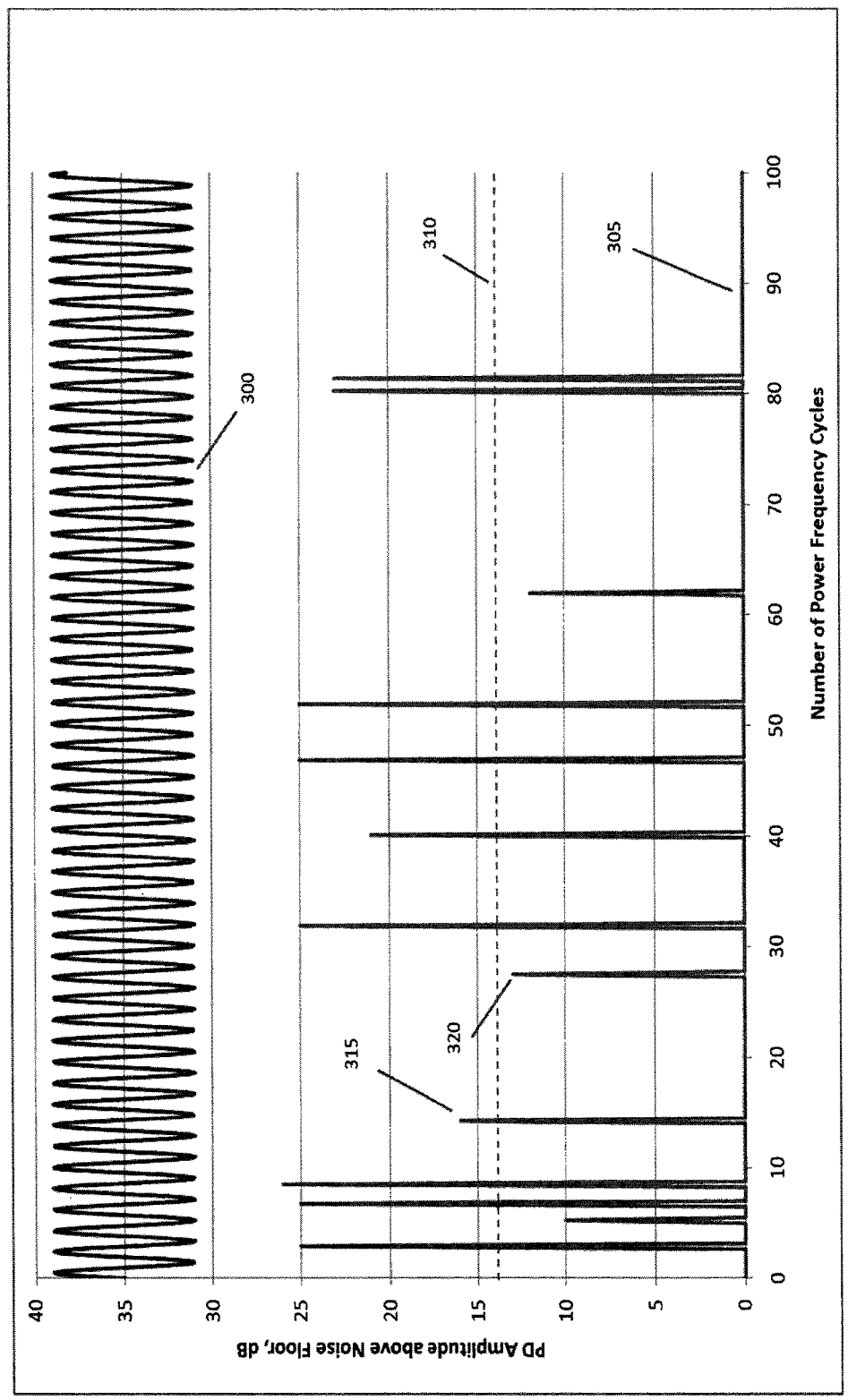
FIG. 3 is a graph that illustrates a calculation of percentage of PD signals that exceeded a certain measure.

FIG. 3 is a graph that illustrates a calculation of a percentage of cycles having one or more PD signals that exceeded a certain threshold. Any desired number of cycles may be considered, but here, for the purpose of illustration, 100 cycles of a power line waveform 300 is considered. The cycle numbers, i.e., 1 through 100, are plotted on a horizontal axis 305. A threshold 310 is set at 14 dB above the noise floor. PD signals below threshold 310, such as PD signal 320, are ignored. There are ten PD signals, one of which is designated as PD signal 315, that exceed threshold 310. Each of the ten PD signals is in a separate cycle, meaning that there are 10 cycles that contain PD signals. Accordingly, the percentage of cycles having signals exceeding threshold 310 is 10/100 or 10%. Although not shown in FIG. 3, if a cycle has more than one PD signal that exceeds threshold 310, that cycle would be counted once, not multiple times. In other words, for the present calculation, the parameter of interest is not the number of PD signals that exceed the threshold, but the number of cycles having one or more PD signals that exceed the threshold.

While FIG. 3 shows a PD percentage calculated for a contiguous set of cycles, it is not necessary to sample every cycle. Instead, cycles may be sampled, one at a time, scattered throughout a period of several thousand cycles, or any desired number of cycles, without loss of accuracy, due to the unsteady but essentially repetitive timing of partial discharges.

A percentage of cycles exceeding a particular value of one of the several measures mentioned above, (i.e., such as a magnitude 205 of a highest magnitude pulse occurring during a power voltage cycle, onset or earliest phase angles 230 and 235 of a PD pulse signal, the total areas 215 and 216 under a magnitude-time graph for the power voltage cycle, and the phase widths 220 and 225 of a PD signal within a power voltage cycle), may be an indication of probable near term failure of a cable or device on a power line. Similarly, a rapid rate of increase of a percentage of cycles exceeding a particular value of one of the above measures is an indication of probable near term failure of a cable or device on a power line.

A PD measure, or a percentage of a PD measure that exceeds a certain threshold, may be used as a criterion for generating an alarm or a recording of a data packet in a data logging file. In addition, an increase of a PD measure, or percentage of a PD measure that exceeds a certain threshold, may be compared to an "increase threshold," and may trigger an alert or alarm, as well as a recording of a data packet in the same data logging file.

Node 115 records a routine periodic packet in a data logging file, typically once per hour. Each packet may include both a selection of the above measures for each frequency channel, and raw PD magnitude data sampled during a single power frequency cycle, allowing reconstruction of an oscilloscope trace of the strongest PD seen during that hour. PD in each of a set of different devices, such as cables, connectors, and splices, may have a unique signature of phases and magnitude variations.

Figure 6:
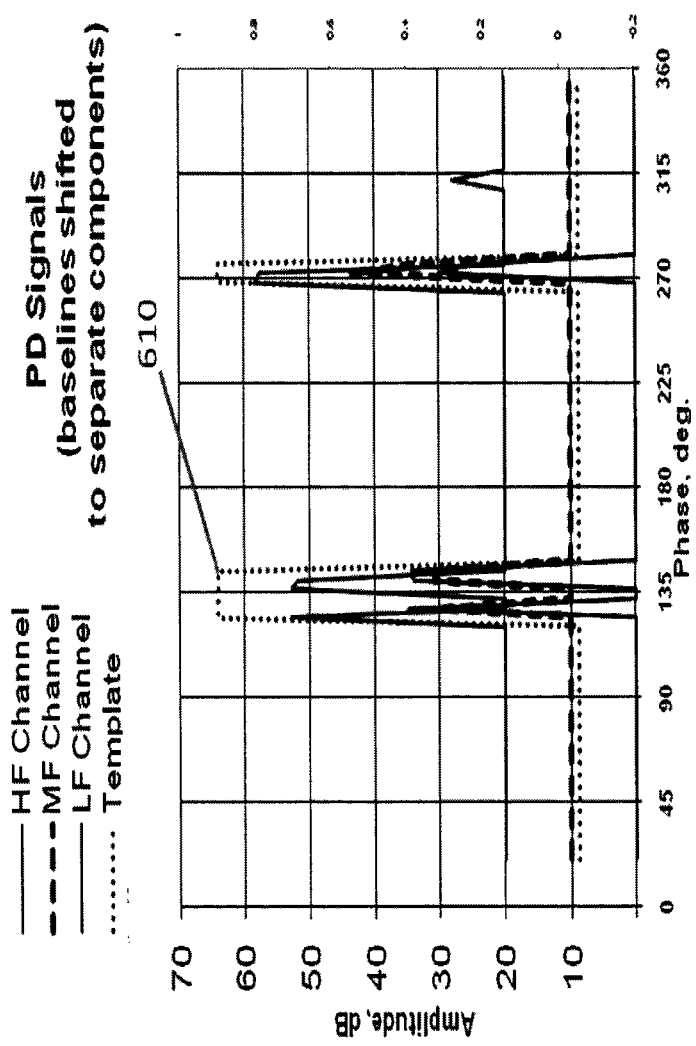
FIG. 6 is an example of a graph of an oscilloscope trace of the strongest PD seen during a period of time.

FIG. 6 is an example of a graph of an oscilloscope trace 620 of the strongest PD seen during a period of time. The trace may assist in identifying the type of device creating the PD, and later assist in augmenting the processing of raw data to automatically identify patterns. To automate distinguishing between different PD signatures, a template may be created for each. For example, a template function 610 may be created that resembles the salient features of a trace, and then subsequent new raw data vectors may be multiplied in dot product form with template function 610. A large magnitude dot product indicates a similarity of the new data to the morphology of the template. A method for identifying a species of PD includes developing a family of templates, each derived from data from a different species of PD source, systematically multiplying new data with each of the templates, and determining which template generates the highest magnitude dot product. PD may be due to corona, voids or surface discharge, each having a distinguishable pattern of a range of phases of appearance of PD signals. Using template functions, the method of phase resolved partial discharge may be implemented with minimal data processing resources.

A data logging file comprising raw PD magnitude data sampled during single power frequency cycles is recorded separately from alerts and alarms that node 115 sends to monitoring station 135, and is generally more detailed. While alerts and alarms serve dispatchers in making maintenance and repair decisions in real time, a logging file is useful for analyzing a progression of raw PD or peak current recordings leading up to an outage, flicker, surge, voltage sag, etc.

As both PD and utility events typically have statistical distributions rather than direct and immediate causality, statistically significant correlations are best realized when a collection of data and events take place over a significant period of time, and a substantial geographical area. The results may take a form that for a given magnitude or increase of PD measure, there is a particular probability of failure within a next time period, such as the next month.

Utility companies keep a diary record of outages and other problems, and other information that line crews discover in the process of diagnosing these problems. This information is saved in a database (not shown) in utility event logger 145. This information is fed to monitoring station 135, and processor 140 executes a process to correlate PD data, peak current (PC) data and utility events. When high correlations are found between one or more PD or PC measures, and between subsequent outages, then these measures can be given increased weight for alert-generating and alarm-generating processes.

FIG. 4 is a table, namely a Table 400, that shows an example of PD percentages and a simulated alert and alarm output from monitoring station 135. Monitoring is performed in epochs of 12 hours, for example. Each monitoring epoch comprises a number of mini-epochs of 1 minute, for example. Node 115 calculates a percentage parameter that indicates a percentage of power frequency cycles within a mini-epoch in which the PD magnitude exceeded a threshold. Monitoring station 135 compares outputs from node 115 and its adjacent nodes, and upon finding a highest frequency channel to be active, issues and records a series of alerts and alarms for various PD percentage measures.

In Table 400, columns are labeled with numbers, and defined as follows:
1 Data/Time of the beginning of a monitoring epoch;
2 Percentage of cycles that PD magnitude exceeded an absolute threshold of 40;
3 Percentage Parameter whose value was at least 10%;
4 Percentage of cycles that area under magnitude-time graph for a power voltage cycle exceeded an absolute threshold of 60;
5 Occurrence of 10% of (4);
6 Onset phase of PD was earlier than 70 degrees;
7 Outage, noted by a value of 1; and
8 Date/Time of an outage.

Referring again to FIG. 1A, processor 140 receives outage notification with its data and time of occurrence 150 from utility event logger 145, and performs a regression analysis, using multiple histories such as shown in Table 400. Such historical data may be used to discern a relationship between a first variable, such as a PD measure, and a second variable, such as a subsequent outage.

Table 400 highlights several events that are designated by labels 410, 415, 420 and 425. For the example shown in Table 400, a measure shown in column 2 had a threshold of 40, a measure shown in column 4 had a threshold of 60, and a measure shown in column 6 had a threshold of 35. Label 420 shows the measure of column 2 reaching a value of 40, causing a processor in node 115 to issue an alarm to monitoring station 135. Similarly, a measure shown in column 4 had a threshold of 60, and upon reaching that value at label 425 the processor issued its alarm. The measure of column 6 never reached its threshold of 35, yielding no further alarms. The figures in columns 3 and 5 show when minimal changes of 10% occurred, relative to a previous increase of 10%, and those figures also indicate when a "change alert" would be sent to monitoring station 135. An outage indicated by label 410 occurred about 59.5 hours after an alarm indicated by label 420, and about 35.5 hours after alarm at label 425. Alarms from node 115 and/or other nodes can act to alert monitoring station 135, in advance of an outage, and the rapidity of alert arrivals can indicate whether cable 125 or device deterioration is rapid and a fault imminent. Over time, a utility would observe patterns of alarms and gradually refine which patterns justify dispatching a repair crew and which patterns may not predict an impending outage, in the same way that a physician regards certain medical test results as indicative of a need for further monitoring but not necessarily surgical intervention.

In the example of Table 400, measures are shown as calculated every 12 hours, but in practice, that period would typically be much shorter, for example hourly.

Regression analysis is applied to a collection of outages and PD measures such as shown in Table 400. Using the results of regression analysis, an alarm may be based on a weighted sum of separate alarms, where weights are highest for those PD measures for which correlation with later outages was highest.

Figure 5:
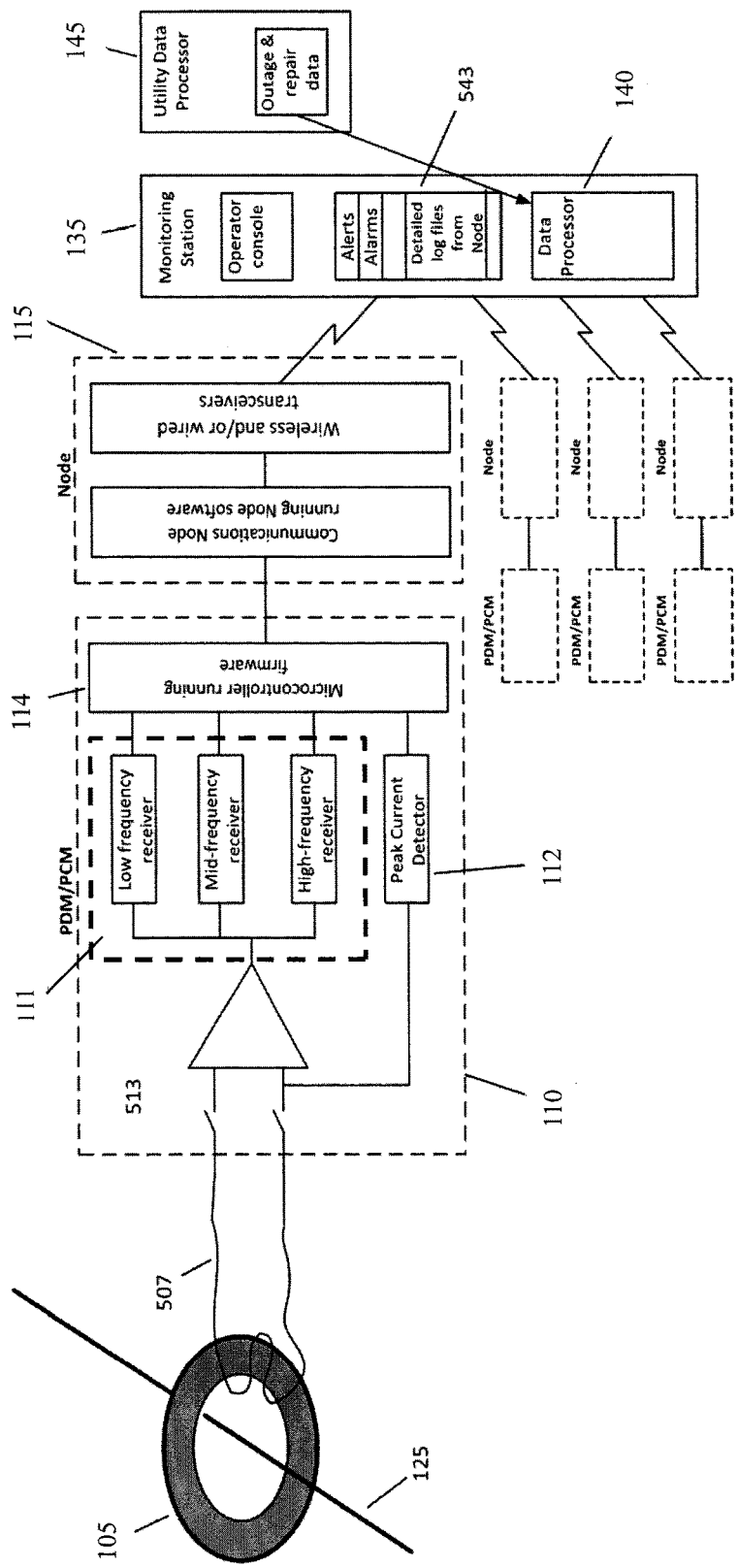
FIG. 5 is a block diagram of a portion of the system of FIG. 1A.

FIG. 5 is a block diagram of a portion of system 100, showing greater detail of some of its components. Processing of signals derived from a raw signal 507 from coupler 105 occur at three levels of hierarchy. That is, there are three processors, namely (a) processor 114 in detector 110, (b) a node 515, and (c) processor 140 in monitoring station 135. Thus, in system 100, processing functions are variously distributed between processor 114, node 115, and may be further distributed to processor 140, and as such, data processing is distributed along different levels of hierarchy. However, distributions of processing other than that described herein may achieve the same results.

By examining detailed data log files 543 generated by node 115, in particular those time stamps that precede an outage, processes may be improved so as to improve the correlation between predicted outages and subsequent actual outages. Detailed data log files 543 comprise a time stamp, a code expressing a node's interpretation of a justification for a log file, peak power line current, PD measures such as area under a PD curve during a power frequency cycle for each frequency band, a highest PD peak for each frequency band, the phases of these peaks, and the sampled data at 90 data points for each channel, each data point representing a phase bin of 4 degrees, i.e., 360 degrees=90×4 degrees. Node justifications for log files include periodic routine recording, or increases in peak current or PD requiring alerts and alarms.

While system 100 shows only one coupler 105 feeding one detector 110 attached to node 115, multiple pairs of couplers and detectors, such as coupler 105 and detector 110, respectively, may be connected to node 115. For example, three couplers and three detectors may be connected to node 115, each sensing a different phase of a three phase power line.

Processor 114 is an electronic device configured of logic circuitry that responds to and executes instructions, and has an associated memory (not shown). The memory is a tangible computer-readable storage medium encoded with a computer program. In this regard, the memory stores data and instructions, i.e., program code, that are readable and executable by processor 114 for controlling the operation of processor 114. The memory is a device that may be implemented in a random access memory (RAM), a hard drive, a read only memory (ROM), or a combination thereof One of the components of the memory is a program module (not shown).

The program module contains instructions for controlling processor 114 to execute the methods described herein. In the present document, although we describe operations being performed by a method or a process, the operations are actually being performed by a processor, such as processor 114.

The term "module" is used herein to denote a functional operation that may be embodied either as a stand-alone component or as an integrated configuration of a plurality of subordinate components. Thus, the program module may be implemented as a single module or as a plurality of modules that operate in cooperation with one another. Moreover, although the program module is described herein as being installed in the memory, and therefore being implemented in software, it could be implemented in any of hardware (e.g., electronic circuitry), firmware, software, or a combination thereof.

While the program module is indicated as being already loaded into the memory, it may be configured on a storage device (not shown) for subsequent loading into the memory. The storage device is a tangible computer-readable storage medium that stores data and instructions thereon. Examples of the storage device include a compact disk, a magnetic tape, a read only memory, an optical storage media, a hard drive or a memory unit consisting of multiple parallel hard drives, and a universal serial bus (USB) flash drive. Alternatively, the storage device can be a random access memory, or other type of electronic storage device, located on a remote storage system and coupled to processor 114 via data network (not shown).

Node 115 and processor 140 are configured similarly to processor 114 in that they are electronic device configured of logic circuitry, and have associated memories with data and instructions stored thereon for controlling their respective operations.

System 100 performs a method that includes (a) detecting a partial discharge on a power line that carries a power signal, (b) measuring a characteristic of the partial discharge, thus yielding a measured characteristic, (c) determining that the measured characteristic satisfies a measurement criterion, thus yielding a qualified partial discharge, (d) incrementing a count of cycles of the power signal that contain qualified partial discharges, (e) calculating, for a plurality of cycles of the power signal, based on the count, a percentage of the plurality of cycles that contain qualified partial discharges, and (f) utilizing the percentage in a subsequent operation.

The method may be performed by any of processor 114, node 115 and processor 140, individually, or in combination with one another. That is, each of processor 114, node 115 and processor 140, may perform the method by itself, or each of the three processors may perform a portion of the method. Thus, the term "processor" may refer to an individual physical processor, or to two or more of the physical processors operating in cooperation with one another.

In the method, the subsequent operation can include determining that the percentage satisfies a percentage criterion, and issuing an alert.

In the method, the characteristic can be a magnitude of the partial discharge, and the measurement criterion can be a magnitude criterion. The characteristic can also include a phase of a cycle of the power signal at which the partial discharge occurred. The partial discharge can be a partial discharge having a greatest magnitude in a cycle of the power signal. Additionally, the plurality of cycles can be regarded as a first plurality of cycles having a first plurality of qualified partial discharges, and the method can further include (i) calculating a first representative magnitude for the first plurality of qualified partial discharges, (ii) repeating, after a passage of time, the detecting, the measuring, the determining, the incrementing, and the calculating, for a second plurality of cycles of the power signal having a second plurality of qualified partial discharges, and (iii) calculating a second representative magnitude for the second plurality of qualified partial discharges, where the subsequent operation includes (A) calculating an amount of change from the first representative magnitude to the second representative magnitude, (B) determining that the amount of change exceeds an amount of change criterion, and (C) issuing an alert.

The plurality of cycles can be regarded as a first plurality of cycles, and the percentage can be regarded as a first percentage, and the method can further include (i) repeating, after a passage of time, the detecting, the measuring, the determining, the incrementing, and the calculating, for a second plurality of cycles of the power signal, to yield a second percentage, and the subsequent operation can include (A) calculating a percentage change from the first percentage to the second percentage, (B) determining that the percentage change exceeds a percentage change criterion, and (C) issuing an alert.

The method can also include (i) receiving an indication of an occurrence of a fault of the power line, (ii) analyzing measured characteristics for a plurality of qualified partial discharges, thus yielding analyzed data, and (iii) determining from the analyzed data, a correlation between the qualified partial discharges and the fault, thus yielding a predictor of the fault.

The power line can be regarded as a first power line, and the method can further include (i) utilizing the predictor in an analysis of partial discharges from a second power line, and (ii) characterizing a condition of the second power line, based on the analysis of partial discharges from the second power line.

The method can also include (i) sensing peak power current flowing through the power line during the plurality of cycles, thus yielding peak power current data, (ii) receiving an indication of an occurrence of a fault of the power line, (iii) analyzing (a) measured characteristics for a plurality of qualified partial discharges, and (b) the peak power current data, thus yielding analyzed data, and (iv) determining from the analyzed data, a correlation between the qualified partial discharges, the peak power current, and the fault, thus yielding a predictor of the fault.

System 100 is also equipped to minimize false alarms. Built-in test equipment comprises a self-test function, actuated upon power up and periodically thereafter. The self-test function disconnects coupler 105 and confirms that a subsequent peak current reading is essentially zero. The self-test function also generates an internal pulse by way of a pulse generator (not shown) that simulates PD and compares the measured data with expected data. In this regard, processor 114 controls a hardware switch 513 that disconnects peak current detector 112 from coupler 105, and runs the self-test function to confirm that an over-current indication is not due to a fault in peak current detector 112 itself. Just after an alarm condition is detected, the self-test function is executed. The self-test function disconnects coupler 105 and confirms a negligible zero offset. The self-test function also generates a simulated current whose measure must be within a predetermined narrow range. Similarly, the three PD channels in detector 111 have their own built-in PD simulator (not shown), and properly working PDMs such as detector 110 can have their performance verified. An alarm indication is sent on only if the self-test function confirms proper functioning.

Continuous alarms may be disruptive, so a facility is provided for an NMS operator to either inhibit alarm repetitive indications of a same type from the same Node/PCM set. In addition, an operator may elect to receive only every Nth alarm after a first one, where an operator may select an integer value N. This mechanism sends an alarm inhibiting message to a node. Thus, an operator is neither unduly distracted nor lulled into a false sense of security by a total blockage of alarms.

PD and arcing generate both electromagnetic waves and sound waves. As such, an ultrasonic microphone sensor (not shown) is another device that may be employed for quantifying PD. A series of ultrasonic microphones with suitable amplifiers could replace couplers 105 in FIG. 1. Sound pulses generating electrical signals are processed and analyzed by system 100 in a similar fashion to the PD signals transduced by couplers 105.

The techniques described herein are exemplary, and should not be construed as implying any particular limitation on the present disclosure. It should be understood that various alternatives, combinations and modifications could be devised by those skilled in the art. For example, steps associated with the processes described herein can be performed in any order, unless otherwise specified or dictated by the steps themselves. The present disclosure is intended to embrace all such alternatives, modifications and variances that fall within the scope of the appended claims.

The terms "comprises" or "comprising" are to be interpreted as specifying the presence of the stated features, integers, steps or components, but not precluding the presence of one or more other features, integers, steps or components or groups thereof. The terms "a" and "an" are indefinite articles, and as such, do not preclude embodiments having pluralities of articles.

What is claimed is:

1. A method for analyzing a partial discharge on a power line in an electrical power distribution system, the method comprising steps of:
    coupling, by an inductive coupler of an analyzing system coupled to the electrical power distribution system, the partial discharge on the power line that carries a power signal;
    detecting, by a detector of the analyzing system, the partial discharge on the power line that carries the power signal;
    measuring, by a sensor of the analyzing system, a characteristic of said partial discharge, thus yielding a measured characteristic;
    determining, by a processor of the analyzing system, that said measured characteristic satisfies a measurement criterion, thus yielding a qualified partial discharge;
    sensing, by the detector, peak power current flowing through said power line during a plurality of cycles of said power signal, thus yielding peak power current data;
    receiving, by the processor, an indication of an occurrence of a fault of said power line;
    analyzing, by the processor, (a) measured characteristics for a plurality of qualified partial discharges, and (b) said peak power current data, thus yielding analyzed data; and
    determining, by the processor, from said analyzed data, a correlation between said plurality of qualified partial discharges, said peak power current, and said fault of said power line, thus yielding a predictor of said fault.

2. The method of claim 1, further comprising steps of:
    incrementing, by the processor, a count of cycles of said power signal that contain qualified partial discharges;
    calculating, by the processor, for said plurality of cycles of said power signal, based on said count of cycles, a percentage of said plurality of cycles that contain said qualified partial discharges;
    determining, by the processor, that said percentage satisfies a percentage criterion; and
    issuing, by the processor, an alert.

3. The method of claim 2, wherein said plurality of cycles of said power signal comprises a first plurality of cycles of said power signal having a first plurality of qualified partial discharges, and wherein said method further comprises:
    calculating, by the processor, a first representative magnitude for said first plurality of qualified partial discharges;
    repeating, by the processor, after a passage of time, said detecting step, said measuring step, said determining step, said incrementing step, and said calculating step, for a second plurality of cycles of said power signal having a second plurality of qualified partial discharges; and
    calculating, by the processor, a second representative magnitude for said second plurality of qualified partial discharges,
    wherein said calculating step further comprises:
        calculating, by the processor, an amount of change from said first representative magnitude to said second representative magnitude;
        determining, by the processor, that said amount of change exceeds an amount of change criterion; and
        issuing, by the processor, said alert.

4. The method of claim 2, wherein said plurality of cycles of said power signal comprises a first plurality of cycles of said power signal, and wherein said percentage comprises a first percentage, and wherein said method further comprises:
    repeating, by the processor, after a passage of time, said detecting step, said measuring step, said determining step, said incrementing step, and said calculating step, for a second plurality of cycles of said power signal, to yield a second percentage, wherein said repeating step further comprises:
        calculating, by the processor, a percentage change from said first percentage to said second percentage;
        determining, by the processor, that said percentage change exceeds a percentage change criterion; and
        issuing, by the processor, said alert.

5. The method of claim 1, wherein said measured characteristic comprises a magnitude of said partial discharge, and wherein said measurement criterion comprises a magnitude criterion.

6. The method of claim 5, wherein said partial discharge is a partial discharge having a highest magnitude in a cycle of said power signal.

7. The method of claim 1, wherein said characteristic comprises a phase of a cycle of said power signal at which said partial discharge occurred.

8. The method of claim 1, wherein said power line is a first power line, and wherein said method further comprises:
    utilizing, by the processor, said predictor in an analysis of partial discharges from a second power line; and
    characterizing, by the processor, a condition of said second power line, based on said analysis of said partial discharges from said second power line.

9. The method of claim 1, wherein said characteristic comprises a total area under a magnitude-time graph for the partial discharge.

10. The method of claim 1, wherein said characteristic comprises a pulse width of the partial discharge.

11. A method for analyzing a partial discharge on a power line in an electrical power distribution system, the method comprising steps of:
coupling, by an inductive coupler of an analyzing system coupled to the electrical power distribution system, the partial discharge on the power line that carries a power signal;
detecting, by a detector of the analyzing system, the partial discharge on the power line that carries the power signal;
measuring, by a processor of the analyzing system, a characteristic of said partial discharge, thus yielding a measured characteristic;
determining, by the processor, that said measured characteristic satisfies a measurement criterion, thus yielding a qualified partial discharge;
incrementing, by the processor, a count of cycles of said power signal that contain qualified partial discharges;
calculating, by the processor, for a plurality of cycles of said power signal, based on said count of cycles, a percentage of said plurality of cycles that contain qualified partial discharges;
utilizing, by the processor, said percentage in a subsequent step;
sensing, by the detector, peak power current flowing through said power line during said plurality of cycles, thus yielding peak power current data;
receiving, by the processor, an indication of an occurrence of a fault of said power line;
analyzing, by the processor, (a) measured characteristics for a plurality of qualified partial discharges, and (b) said peak power current data, thus yielding analyzed data; and
determining, by the processor, from said analyzed data, a correlation between said plurality of qualified partial discharges, said peak power current, and said fault of said power line, thus yielding a predictor of said fault.

12. The method of claim 11, wherein said measured characteristic comprises a magnitude of said partial discharge, and wherein said measurement criterion comprises a magnitude criterion.

13. The method of claim 11, wherein said characteristic comprises a phase of a cycle of said power signal at which said partial discharge occurred.

14. The method of claim 11, wherein said characteristic comprises a total area under a magnitude-time graph for the partial discharge.

15. The method of claim 11, wherein said characteristic comprises a pulse width of the partial discharge.

16. The method of claim 11, wherein the analyzing system further comprises multiple sets of inductive couplers, detectors, and processors located at multiple locations along the power line and a monitoring station communicating with each of the multiple sets of the inductive couplers, the detectors, and the processors to localize an outage-causing fault and observe precursors of the outage-causing fault before the outage-causing fault occurs.

17. The method of claim 11, wherein said subsequent step comprises:
determining, by the processor, that said percentage satisfies a percentage criterion; and
issuing, by the processor, an alert.

18. A system for analyzing a partial discharge on a power line in an electrical power distribution system, the system comprising:
an inductive coupler that couples the partial discharge from the power line that carries a power signal;
a detector, downstream of said inductive coupler, that detects said partial discharge;
a processor, downstream of said inductive coupler; and
a memory that contains instructions that are readable by said processor to cause said processor to perform operations that comprise steps to:
measure a characteristic of said partial discharge, thus yielding a measured characteristic;
determine that said measured characteristic satisfies a measurement criterion, thus yielding a qualified partial discharge;
sense peak power current flowing through said power line during a plurality of cycles of said power signal, thus yielding peak power current data;
receive an indication of an occurrence of a fault of said power line;
analyze: (a) measured characteristics for a plurality of qualified partial discharges, and (b) said peak power current data thus yielding analyzed data; and
determine from said analyzed data, a correlation between said plurality of qualified partial discharges, said peak power current, and said fault of said power line, thus yielding a predicator of said fault.

19. The system of claim 18, wherein said steps further comprise:
increment a count of cycles of said power signal that contain qualified partial discharges;
calculate, for said plurality of cycles of said power signal, based on said count of cycles, a percentage of said plurality of cycles that contain said qualified partial discharges;
determine that said percentage satisfies a percentage criterion; and
issue an alert.

20. The system of claim 19, wherein said plurality of cycles of said power signal comprises a first plurality of cycles of said power signal, and said percentage is a first percentage, and wherein said instructions also cause said processor to perform operations of:
repeat, after a passage of time, said detect operation, said measure operation, said determine operation, said increment operation, and said calculate operation, for a second plurality of cycles of said power signal, to yield a second percentage,
wherein said repeat operation further comprises to:
calculate a percentage change from said first percentage to said second percentage;
determine that said percentage change exceeds a percentage change criterion; and
issue said alert.

21. The system of claim 18, wherein said measured characteristic comprises a magnitude of said partial discharge, and wherein said measurement criterion comprises a magnitude criterion.

22. The system of claim 18, wherein said power line is a first power line, and wherein said instructions also cause said processor to perform operations that comprise one or more steps to:
utilize said predictor in an analysis of partial discharges from a second power line; and characterize a condition of said second power line, based on said analysis of said partial discharges from said second power line.

23. The system of claim 18, wherein said characteristic comprises a phase of a cycle of said power signal at which said partial discharge occurred.

24. The system of claim 18, wherein said characteristic comprises a total area under a magnitude-time graph for the partial discharge.

25. The system of claim 18, wherein said characteristic comprises a pulse width of the partial discharge.

26. A system comprising:
an inductive coupler that couples a partial discharge from a power line that carries a power signal;
a detector, downstream of said inductive coupler, that detects said partial discharge;
a processor, downstream of said inductive coupler; and
a memory that contains instructions that are readable by said processor to cause said processor to perform operations that comprise steps to:
measure a characteristic of said partial discharge, thus yielding a measured characteristic;
determine that said measured characteristic satisfies a measurement criterion, thus yielding a qualified partial discharge;
increment a count of cycles of said power signal that contain qualified partial discharges;
calculate, for a plurality of cycles of said power signal, based on said count, a percentage of said plurality of cycles that contain qualified partial discharges;
utilize said percentage in a subsequent operation;
sense peak power current flowing through said power line during said plurality of cycles, thus yielding peak power current data;
receive an indication of an occurrence of a fault of said power line;
analyze (a) measured characteristics for a plurality of qualified partial discharges, and (b) said peak power current data, thus yielding analyzed data; and
determine from said analyzed data, a correlation between said plurality of qualified partial discharges, said peak power current, and said fault of said power line, thus yielding a predictor of said fault.

27. The system of claim 26, wherein said measured characteristic comprises a magnitude of said partial discharge, and wherein said measurement criterion comprises a magnitude criterion.

28. The system of claim 26, wherein said characteristic comprises a phase of a cycle of said power signal at which said partial discharge occurred.

29. The system of claim 26, wherein said measured characteristic comprises a total area under a magnitude-time graph for the partial discharge.

30. The system of claim 26, wherein said characteristic comprises a pulse width of the partial discharge.

31. The system of claim 26, further comprises multiple sets of inductive couplers, detectors, processors and memories located at multiple locations along the power line and a monitoring station communicating with each of the multiple sets of the inductive couplers, the detectors, the processors and the memories to localize an outage-causing fault and observe precursors of the outage-causing fault before the outage-causing fault occurs.

32. The system of claim 26, wherein said subsequent operation comprises:
determine that said percentage satisfies a percentage criterion; and
issue an alert.

* * * * *